(12) United States Patent
Kondo

(10) Patent No.: US 12,140,636 B2
(45) Date of Patent: Nov. 12, 2024

(54) LOAD TEST DEVICE AND CAP OF LOAD TEST DEVICE

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 125 days.

(21) Appl. No.: 17/915,342

(22) PCT Filed: May 18, 2021

(86) PCT No.: PCT/JP2021/018746
§ 371 (c)(1),
(2) Date: Sep. 28, 2022

(87) PCT Pub. No.: WO2021/246158
PCT Pub. Date: Dec. 9, 2021

(65) Prior Publication Data
US 2023/0147732 A1    May 11, 2023

(30) Foreign Application Priority Data
Jun. 4, 2020 (JP) .................................. 2020-097409

(51) Int. Cl.
*G01R 31/34* (2020.01)
*G01K 5/56* (2006.01)
(Continued)

(52) U.S. Cl.
CPC ............. *G01R 31/343* (2013.01); *G01K 5/56* (2013.01); *G01K 11/12* (2013.01); *G01R 31/1209* (2013.01); *G08C 17/02* (2013.01)

(58) Field of Classification Search
CPC .... G01R 31/343; G01R 31/1209; G01K 5/56; G01K 11/12; G08C 17/02
See application file for complete search history.

(56) References Cited

U.S. PATENT DOCUMENTS 9,857,433 B2\* 1/2018 Kondo ................... G01R 17/02
9,885,756 B2\* 2/2018 Kondo ............... G01R 31/2879
(Continued)

FOREIGN PATENT DOCUMENTS

CN      111007368 A    4/2020
JP      S60-62811 U1   5/1985
(Continued)

OTHER PUBLICATIONS

International Search Report issued in PCT/JP2021/018746 mailed on Jul. 27, 2021 with English Translation (7 pages).
(Continued)

*Primary Examiner* — Dominic E Hawkins
(74) *Attorney, Agent, or Firm* — Nakanishi IP Associates, LLC

(57) ABSTRACT

A load test device includes: a resistor unit that includes a plurality of resistors that receive supplied power and a wall (holding frame) that holds opposite ends of each of the plurality of resistors; and an insulating cap that is attached to a portion of a terminal of the resistor that protrudes from the wall. The cap is composed of a material that is deformed by heat. When a temperature of the terminal becomes equal to or higher than a first temperature, the cap is deformed by heat and detached from the terminal.

12 Claims, 14 Drawing Sheets

(51) Int. Cl.
     *G01K 11/12*     (2021.01)
     *G01R 31/12*     (2020.01)
     *G08C 17/02*     (2006.01)

(56) References Cited

U.S. PATENT DOCUMENTS

| | | | |
|---|---|---|---|
| 2007/0251912 A1* | 11/2007 | Sixou | B65D 79/02 |
| | | | 264/239 |
| 2016/0031185 A1* | 2/2016 | Janousek | H01M 10/4285 |
| | | | 428/209 |
| 2017/0184686 A1 | 6/2017 | Kondo | |
| 2019/0317148 A1* | 10/2019 | Kondo | G01R 31/34 |

FOREIGN PATENT DOCUMENTS

| | | | | | |
|---|---|---|---|---|---|
| JP | 2008-215864 A | | 9/2008 | | |
| JP | 2010-25752 A | | 2/2010 | | |
| JP | 2010-288352 A | | 12/2010 | | |
| JP | 2019124557 A | * | 1/2018 | ............ | G01R 31/34 |
| WO | 2016/067493 A1 | | 5/2016 | | |

OTHER PUBLICATIONS

Written Opinion of International Searching Authority issued in 2021/018746 mailed on Jul. 27, 2021 with English Translation (8 pages).

\* cited by examiner

LOAD TEST DEVICE AND CAP OF LOAD TEST DEVICE

TECHNICAL FIELD

The present invention relates to a load test device.

BACKGROUND ART

Conventionally, as in Patent Literature 1, a dry load test device that performs a load test for a generator has been proposed.

CITATION LIST

Patent Literature

Patent Literature 1: JP 2010-25752 A

SUMMARY OF INVENTION

Technical Problem

Since a high voltage current flows through a load test device, it is desirable to find any failure in any of the members constituting the load test device as early as possible.

Therefore, an object of the present invention is to provide a load test device and the like capable of finding a failure at an early stage.

Solution to Problem

A load test device according to the present invention includes: a resistor unit that includes a plurality of resistors that receive supplied power and a wall that holds opposite ends of each of the plurality of resistors; and an insulating cap that is attached to a portion of a terminal of the resistor that protrudes from the wall.

The cap is composed of a material that is deformed by heat.

When a temperature of the terminal becomes equal to or higher than a first temperature, the cap is deformed by the heat and detached from the terminal.

In a case where the nut is loose, the resistor may generate more heat than in a normal state as compared with a case where the nut is sufficiently fastened.

In a case where the resistor generates more heat than in a normal state, the cap is deformed by the heat and detached from the terminal. For this reason, for example, when the resistor generates more heat than in a normal state, it is possible to easily visually recognize a situation in which the resistor generates heat from the outside due to deformation of the cap and detachment of the cap from the terminal.

That is, it becomes possible to detect a failure of the load test device at an early stage.

The load test device may further include a cover that is attached to a frame holding the resistor unit and protects an exposed portion of the terminal of the resistor that protrudes from the wall.

The cover is composed of a transparent material or a translucent material.

By providing the cover, it is possible to prevent dust or the like from entering from the outside and adhering to the terminal or the like.

As the cover is composed of a transparent material, it becomes possible to visually recognize a region where the terminal is located inside the load test device from the outside.

The cap may include a tubular portion that covers the exposed portion of the terminal that protrudes from the wall, and a lid portion that is provided at one end portion of the tubular portion and faces a distal end of the terminal.

A distance between the cover and the terminal may be larger than a sum of dimensions of the tubular portion and the lid portion in a height direction.

The distance between the terminal and the cover is larger than a dimension of the cap in the height direction (the sum of the dimensions of the tubular portion and the lid portion in the height direction). Therefore, a space where the cap deformed by heat falls downward is sufficiently secured.

By comparing the terminal from which the cap is detached with the terminal covered with the cap, it becomes possible to easily determine a resistor in which a failure has occurred.

The cap may be composed of a material that becomes a first color at a temperature equal to or higher than the first temperature and becomes a second color different from the first color at a temperature lower than the first temperature.

Since the color of the cap changes by heat, it is possible to easily visually recognize, for example, a situation in which the resistor generates heat from the outside by the color change when the resistor generates more heat than in a normal state.

The load test device may further include a first detection unit that acquires information regarding at least one of a temperature, a humidity, a sound, a vibration, an impact, a discharge voltage, or a smell of a region where the terminal and the cap are located inside the frame.

The first detection unit may be electrically connected to at least one of other devices included in the load test device.

At least one of transmission of the information acquired by the first detection unit to an external device or control of stopping power supply to the resistor unit based on the information acquired by the first detection unit may be performed.

The first detection unit detects a temperature, a humidity, a sound, a vibration, an impact, a discharge voltage, a smell, or the like, and thus, in a case where there is an abnormality in the load test device, it becomes possible to stop (perform off control) application of a voltage to the resistor or notify an external device based on these pieces of information.

The first detection unit may include a display unit that emits light based on the information acquired by the first detection unit.

The display unit emits light based on the information acquired by the first detection unit, so that the information regarding whether or not an abnormality has occurred in the load test device can easily be visually recognized from the outside.

The load test device may further include: a first device including a first communication unit that transmits at least a first signal; and a second device including a second communication unit that receives at least the first signal.

The first device and the second device may be arranged in a positional relationship in which at least one of a region where the terminal and the cap are located or a region where a relay for controlling power supply to the resistor unit is located is sandwiched.

At least one of transmission of information regarding radio waves of the signal received by the second communication unit to an external device, control of stopping power supply to the resistor unit based on the information regarding the radio waves of the signal received by the second communication unit, or light emission based on the information regarding the radio waves of the signal received by the second communication unit may be performed.

The load test device may further include: a first device including a first communication unit that transmits at least a first signal; and a second device including a second communication unit that receives at least the first signal.

The second device may transmit a second signal.

The first device may receive the second signal.

The first device and the second device may be arranged in a positional relationship in which at least one of a region where the terminal and the cap are located or a region where a relay for controlling power supply to the resistor unit is located is sandwiched.

At least one of transmission of information regarding radio waves of the first signal received by the second communication unit and information regarding radio waves of the second signal received by the first communication unit to an external device, control of stopping power supply to the resistor unit based on the information regarding the radio waves of the first signal received by the second communication unit and the information regarding the radio waves of the second signal received by the first communication unit, or light emission based on the information regarding the radio waves of the signal received by the second communication unit and the information regarding the radio waves of the second signal received by the first communication unit may be performed.

The load test device may further include an ultrasonic sensor that detects ultrasonic waves.

At least one of transmission of information acquired by the ultrasonic sensor to an external device or control of stopping power supply to the resistor unit based on the information acquired by the ultrasonic sensor may be performed.

In a case where deterioration such as carbonization of the inside of the relay of a relay unit, contamination of an insulator, generation of a leakage current, a failure of the resistor, or the like has occurred, ultrasonic waves may be emitted from a portion where a failure has occurred. Therefore, by detecting the ultrasonic waves and making the ultrasonic wave be audible or visible, it becomes possible to find a failure of the load test device 1 at an early stage.

The load test device may further include: a conversion unit that converts a frequency of a signal obtained by the ultrasonic sensor into a frequency in an audible range; and an output unit that outputs a signal obtained by conversion performed by the conversion unit as a sound.

The load test device may further include a second detection unit that is attached to a specific portion of the load test device and is composed of a member whose color changes according to a state of the specific portion.

The second detection unit may be provided at the specific portion that is visible from the outside through the cover in a state not electrically connecting to another device included in the load test device.

Similarly to the first detection unit, the second detection unit acquires information such as a temperature.

The second detection unit is not electrically connected to and does not communicate with another device.

Therefore, the second detection unit can be more easily arranged in a complicated load test device having many wirings as compared with a detection member that is electrically connected to or communicates with another device, such as the first detection unit.

The cover may vibrate based on electromagnetic waves generated from the resistor.

The cap may include a tubular portion whose opposite ends are opened.

The terminal may be inserted into one end portion of the tubular portion in a state where the other end portion of the tubular portion is opened.

A load test device according to the present invention includes: a resistor unit that includes a plurality of resistors that receive supplied power and a wall that holds opposite ends of each of the plurality of resistors; and an insulating cap that is attached to a portion of a terminal of the resistor that protrudes from the wall.

The cap is deformed by heat and is detached from the terminal when a temperature of the terminal becomes equal to or higher than a first temperature, and/or the cap becomes a first color when the temperature of the cap becomes equal to or higher than the first temperature, and becomes a second color different from the first color when the temperature of the cap becomes lower than the first temperature.

A cap of a load test device according to the present invention is an insulating cap that is attached to a portion of a terminal of a resistor that protrudes from a wall in the load test device including a resistor unit that includes a plurality of the resistors that receive supplied power and the wall that holds opposite ends of each of the plurality of resistors.

The cap is composed of a material that is deformed by heat.

When a temperature of the terminal becomes equal to or higher than a first temperature, the cap is deformed by the heat and detached from the terminal.

Advantageous Effects of Invention

As described above, according to the present invention, it is possible to provide the load test device and the like capable of finding a failure at an early stage.

DESCRIPTION OF EMBODIMENTS

Figure 1:
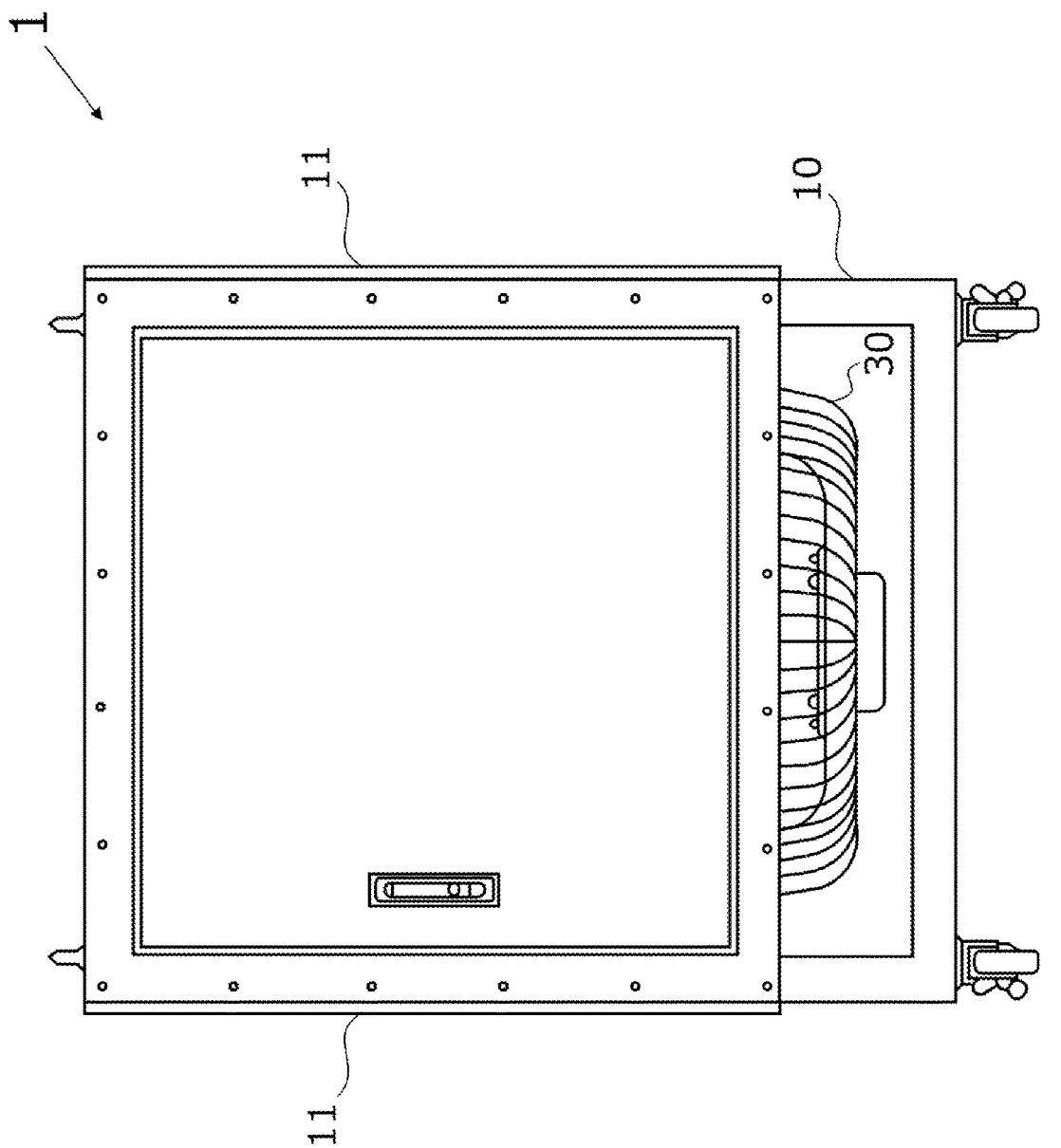
FIG. 1 is a front view of a load test device according to the present embodiment.

Hereinafter, the present embodiment will be described with reference to the drawings.

Note that the embodiment is not limited to the following embodiment. In addition, the contents described in one embodiment are similarly applied to other embodiments in principle. Further, each embodiment and each modification can be appropriately combined.

(Load Test Device 1)

A dry load test device 1 according to the present embodiment includes a frame 10, a resistor unit 20, a relay unit 25, a cooling unit 30, an insulator 35, a connection switching unit 40, a circuit breaker 80, a first detection unit 91, a second detection unit 92, and a communication unit 95 (FIGS. 1 to 11).

Note that, in describing directions, a horizontal direction in which the connection switching unit 40 and the frame 10 are arranged will be described as an x direction, a horizontal direction perpendicular to the x direction will be described as a y direction, and a vertical direction perpendicular to the x direction and the y direction will be described as a z direction.

(Frame 10)

The frame 10 has an upper portion accommodating the resistor unit 20 and a lower portion accommodating the cooling unit 30. In addition, the connection switching unit 40 is provided on a side portion of the frame 10, and casters are provided therebelow.

Figure 2:
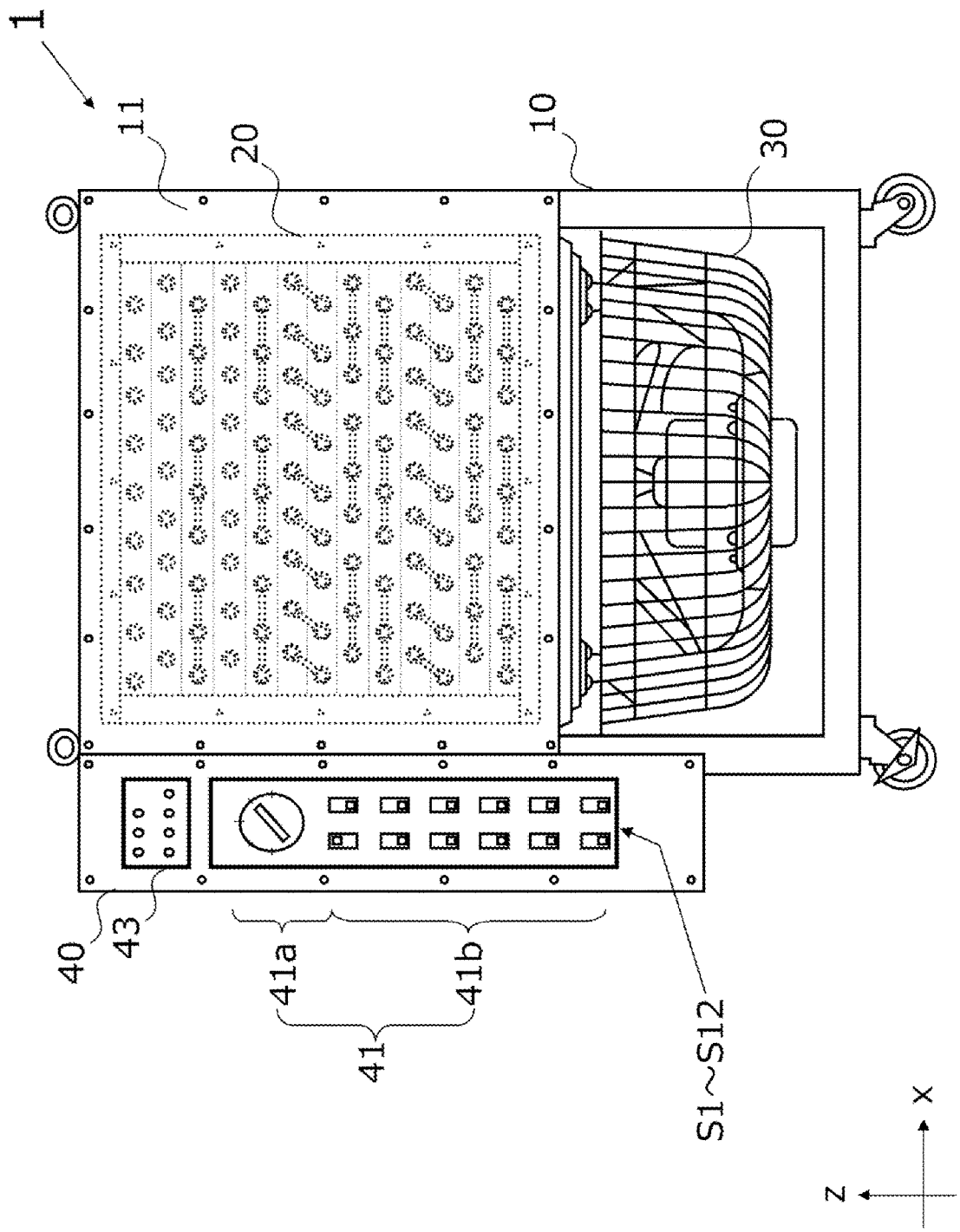
FIG. 2 is a side view of the load test device according to the present embodiment.

Terminals 63, a cable connected to the terminals 63, a short-circuit bar SB connected to the terminal 63, a cover 11 for protecting a holding frame 21 for holding resistors R, and the like are provided on a side surface of the frame 10 (a surface on which the terminals 63 of the resistors R constituting a resistor unit 20 can be seen) (see FIG. 2).

The cover 11 is composed of a transparent material or a translucent material, such as polycarbonate.

The cover 11 is composed of an insulating resin material.

Here, the term "transparent" refers to a property of a substance through light is transmitted, and refers to a state in which transmittance is extremely high, and the other side of the substance can be seen through said substance.

Therefore, in a case where the cover 11 is composed of a transparent material, members provided inside the load test device 1 such as a cap 70 can be clearly seen from the outside of the cover 11 through the cover 11 as illustrated in FIG. 2.

In addition, the term "translucent" refers to a property of transmitting light similarly to the term "transparent", but a shape or the like on the other side cannot be clearly recognized through said translucent material unlike the "transparent" material because transmitted light is diffused or transmittance is low.

Therefore, in a case where the cover 11 is composed of a translucent material, members provided inside the load test device 1 such as the cap 70 can be seen through the cover 11 from the outside of the cover 11 although not as clear as illustrated in FIG. 2.

(Resistor Unit 20)

The resistor unit 20 is formed by arranging a plurality of resistor rows in which a plurality of rod-shaped resistors R parallel to the y direction are arranged at predetermined intervals in the x direction in a plurality of stages in the z direction, and is used to perform a load test for a test target power supply such as a generator or a battery connected via a terminal connection unit 43. The resistor R receives power supplied from the test target power supply.

The resistor unit 20 may be used to perform a load test for an air conditioning facility that cools a computer server or the like.

In the present embodiment, nine resistor rows of the resistors R arranged in the x direction are arranged in 13 stages in the z direction. However, the number of resistors R arranged in each resistor row, the number of stages in which the resistor rows are layered, and the like are not limited thereto.

It is desirable that the resistors R in at least one resistor row (the uppermost resistor row in the example illustrated in FIGS. 4 and 5) are used as spares for replacement in a case where another resistor R fails, and the resistors R constituting the resistor rows in other stages are used as the resistors R constituting first to twelfth resistor groups G1 to G12.

In the resistors R constituting the resistor unit 20, six or twelve resistors R adjacent to each other are set as one resistor group, and the load test is performed while changing the number of resistor groups to which a voltage is to be applied from the test target power supply.

Further, connection in the resistor group (a connection state of the resistors R in the resistor group) may be changed according to the type of the load test target power supply.

The resistor unit 20 includes the first to twelfth resistor groups G1 to G12. The present embodiment shows an example in which the first resistor group G1 including six resistors R (rated capacity: 1 kW) in which each said resistor R has a rated voltage of 400 V and a rated capacity of 1.67 kW, the second resistor group G2 including six resistors R (rated capacity: 2 kW, and the same applies to the third resistor group G3) in which each said resistor R has a rated voltage of 116 V and a rated capacity of 334 W, the fourth resistor group G4 including six resistors R (rated capacity: 5 kW) in which each said resistor R has a rated voltage of 116 V and a rated capacity of 834 W, the fifth resistor group G5 including six resistors R (rated capacity: 10 kW, and the same applies to the sixth resistor group G6) in which each said resistor R has a rated voltage of 116 V and a rated capacity of 1.67 kW, and the seventh resistor group G7 including 12 resistors R (rated capacity: 20 kW, and the same applies to the eighth to twelfth resistor groups G8 to G12) in which each said resistor R has a rated voltage of 116 V and a rated capacity of 1.67 kW are provided. However, the number of resistor groups G, the rated voltage and rated capacity of each resistor R, and the like are not limited to the above-described configuration.

(Resistor R)

The resistor R includes a resistance wire 61, the terminal 63, a nut 66, and a cylindrical portion 67 (see FIGS. 6 to 11).

The terminals 63 are electrically connected to the resistance wire 61 and are provided at opposite ends of the resistance wire 61.

The nut 66 is screwed to the terminal 63 in such a way as to sandwich a first insulating member 65a.

The cylindrical portion 67 holds the terminal 63 via the first insulating member 65a, and covers side surfaces of the resistance wire 61 and a portion of the terminal 63 (a portion not exposed to the outside from a wall constituting the holding frame 21).

A heat radiation fin 69 is provided on a side surface of the cylindrical portion 67.

The terminal 63 of the resistor R is connected to the terminal 63 of another resistor R by the short-circuit bar SB, or connected to the terminal connection unit 43 or the relay via a cable.

The side surface of the resistor R is covered with the holding frame 21 constituted by four walls. However, a part of an end portion of the resistor R such as the terminal 63 protrudes outward (in the y direction) from a region surrounded by the holding frame 21.

In such a positional relationship that a distal end of the terminal 63 attached to the holding frame 21 and the cover 11 attached to the frame 10 are separated by a first distance d1, a portion of the resistor R that is not electrically connected to the terminal 63 (for example, a portion near opposite ends of the cylindrical portion 67 holding the terminal 63 via the first insulating member 65a) is held by the wall constituting said holding frame 21 via a second insulating member 65b.

Figure 6:
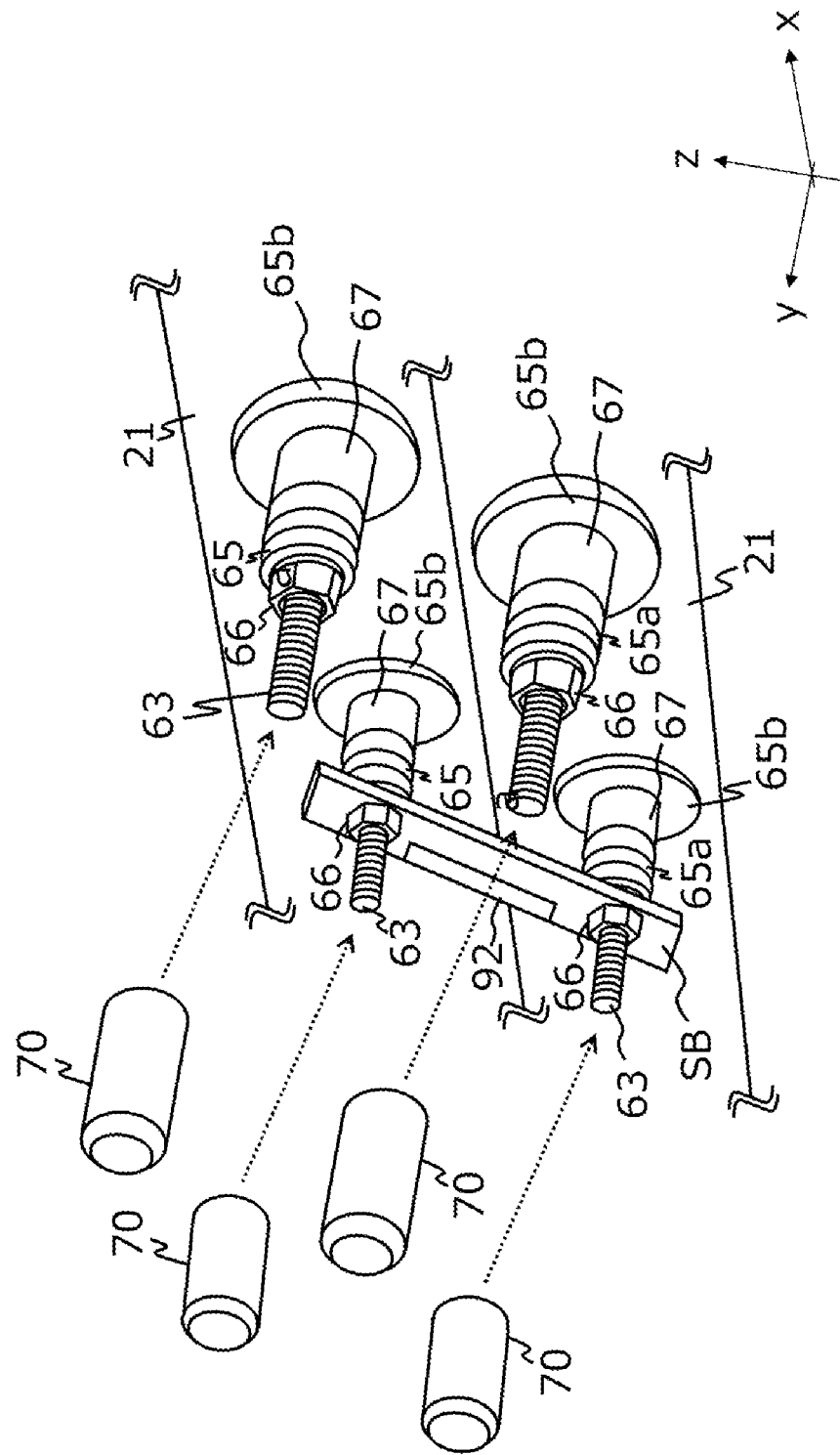
FIG. 6 is a perspective view illustrating the periphery of terminals of resistors before caps are attached.
Figure 7:
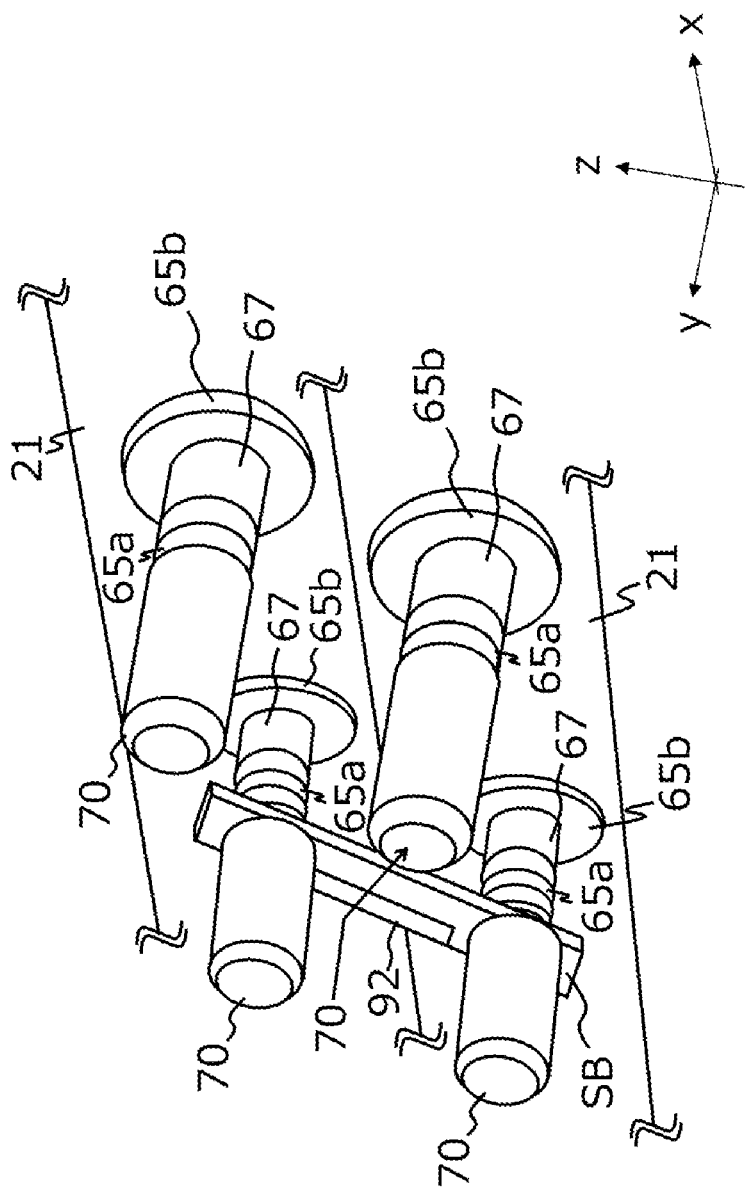
FIG. 7 is a perspective view illustrating the periphery of the terminals of the resistors after the caps are attached.
Figure 8:
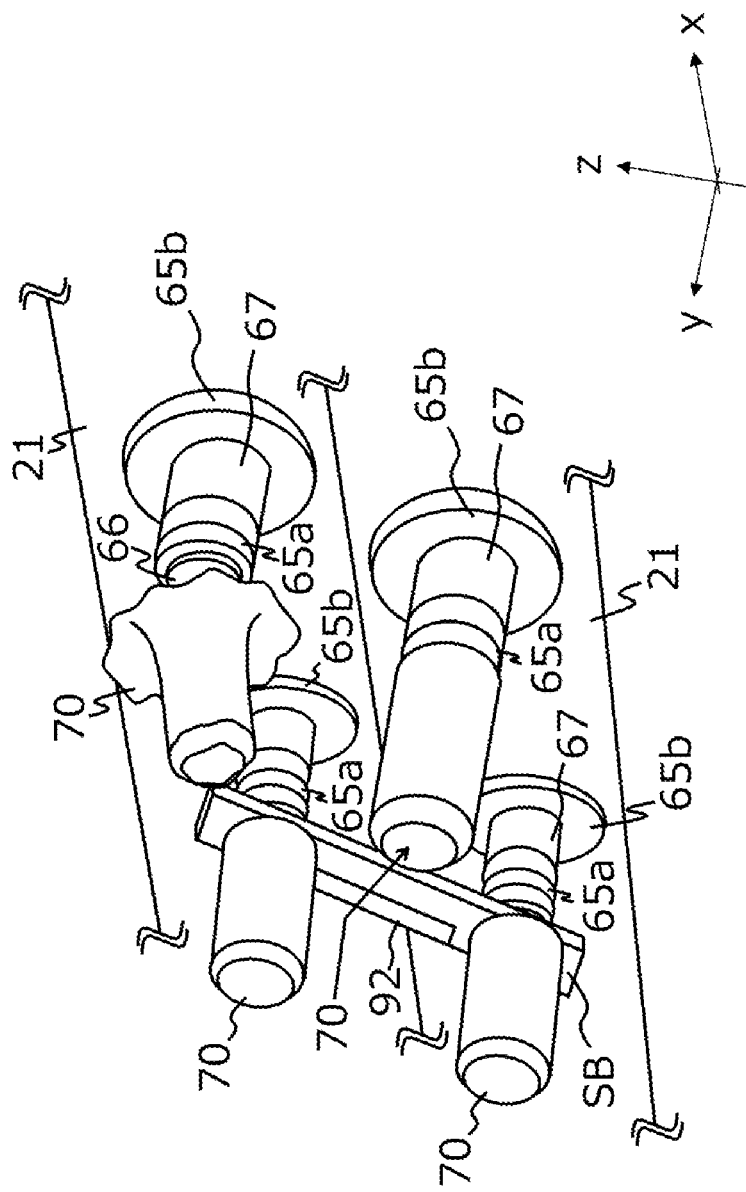
FIG. 8 is a perspective view illustrating the periphery of the terminals of the resistors at the moment when one of the caps is deformed and detached from the terminal.
Figure 9:
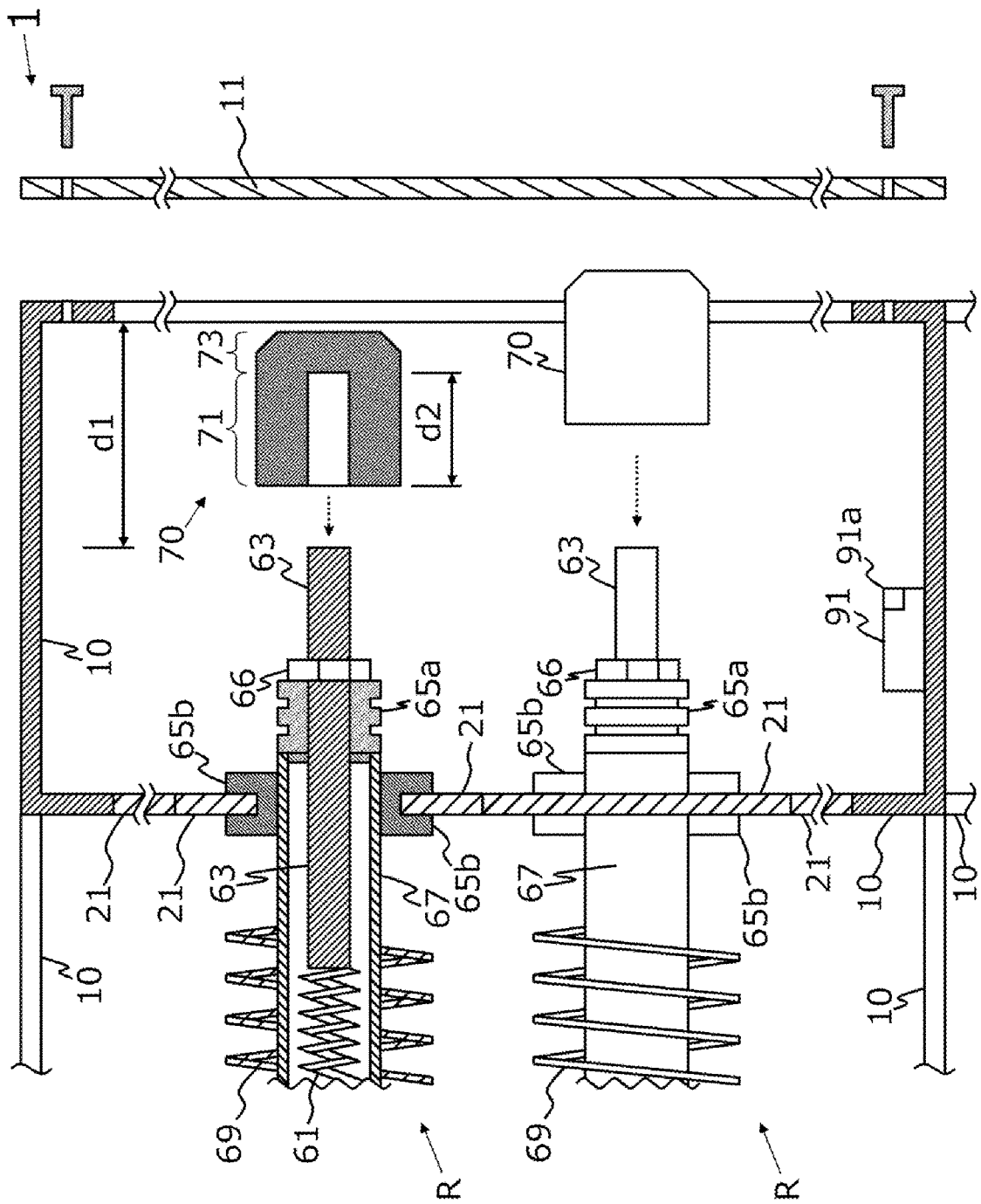
FIG. 9 is a cross-sectional configuration diagram illustrating a positional relationship among the resistors, a holding frame, a cover, and a first detection unit before the cover and the caps are attached.
Figure 10:
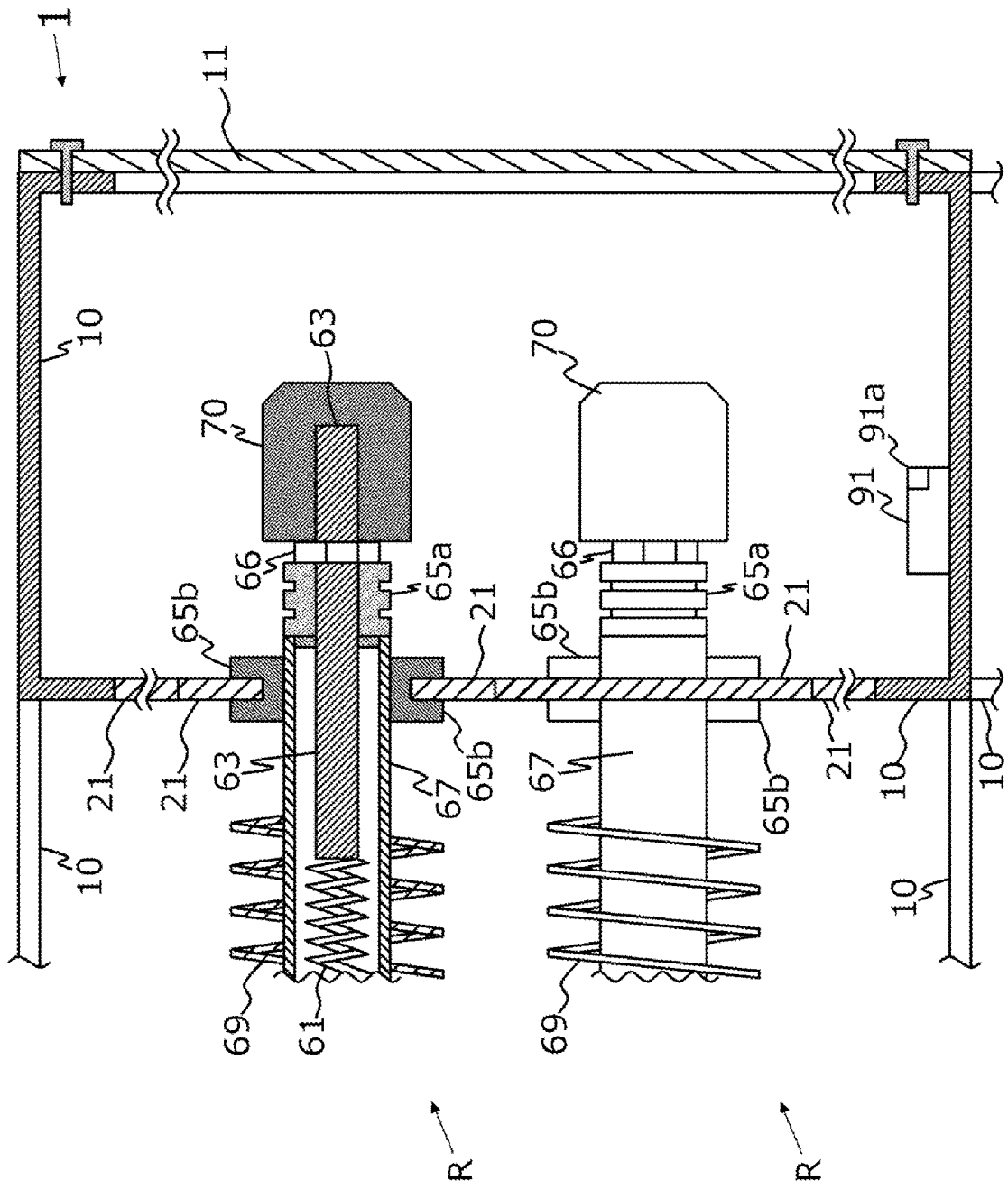
FIG. 10 is a cross-sectional configuration diagram illustrating a positional relationship among the resistors, the holding frame, the cover, and the first detection unit after the cover and the caps are attached.
Figure 11:
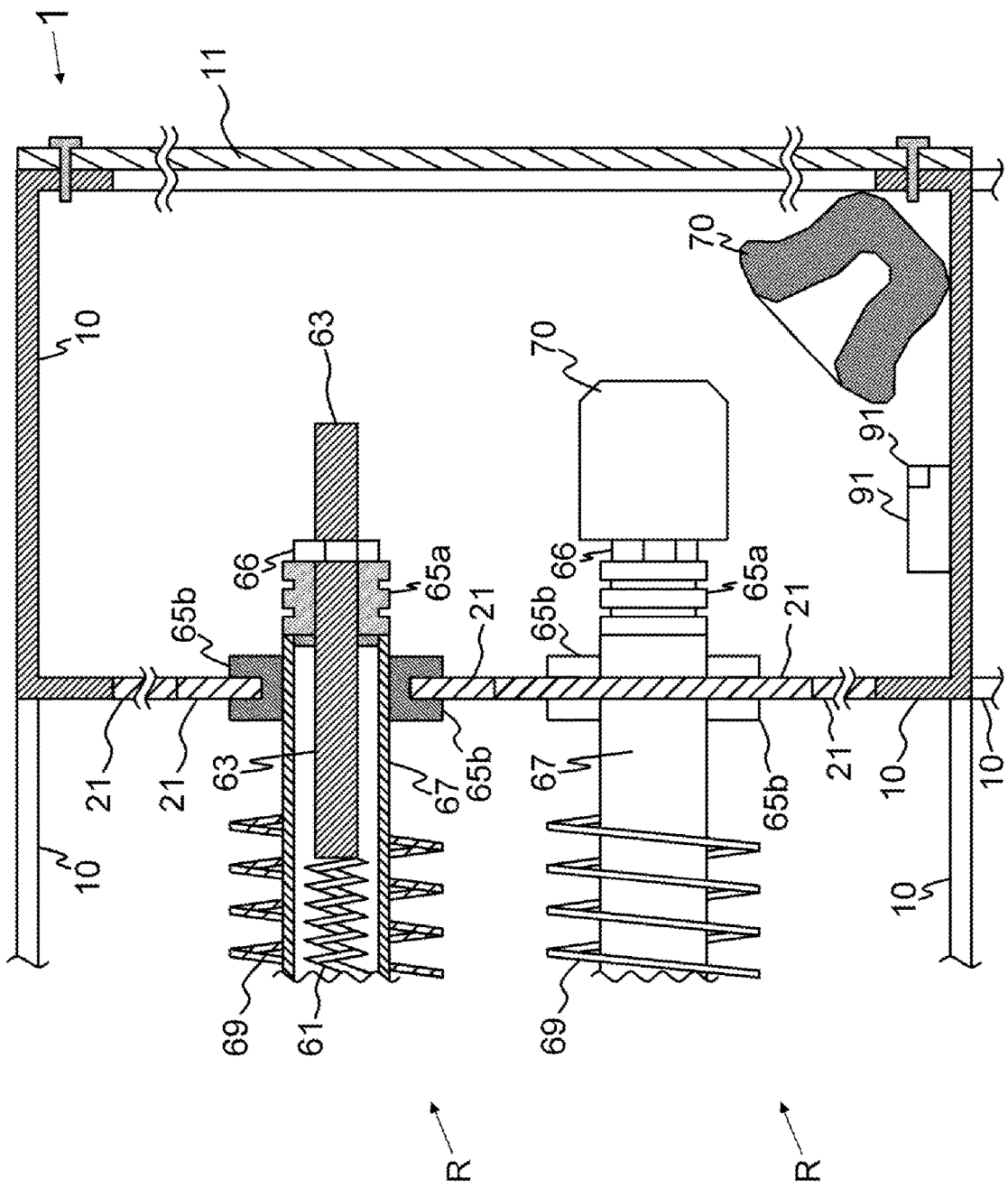
FIG. 11 is a cross-sectional configuration diagram illustrating a positional relationship among the resistors, the holding frame, the cover, and the first detection unit after one of the caps is deformed and detached from the terminal after the cover and the caps are attached.

FIGS. 6 to 8 illustrate end portions of four resistors R held by the holding frame 21, in which the terminals 63 of two resistors R are connected to each other via the short-circuit bar SB.

A length of the first distance d1 is determined in such a way that a space, in which when the cap 70 to be described later is deformed by heat, the deformed cap 70 can fall downward, is formed between the terminal 63 and the cover 11.

For example, the dimensions of the respective portions are determined in such a way that the first distance d1 is larger than the height of the cap 70 (the sum of the dimensions of a tubular portion 71 and a lid portion 73 in the y direction).

Further, the holding frame 21 has an upper surface and a lower surface opened to allow cool air from the cooling unit 30 provided therebelow to flow upward.

(Cap 70)

The cap (protective cover) 70 is put on an exposed portion of the terminal 63 of the resistor R that protrudes from the wall constituting the holding frame 21.

Since the cap 70 covers the terminal 63, it is possible to prevent dust or the like from adhering to the terminal 63.

The cap 70 includes the tubular portion 71 and the lid portion 73.

The tubular portion 71 covers a side surface of the portion of the terminal 63 that protrudes from the wall constituting the holding frame 21.

The lid portion 73 is provided at one end portion of the tubular portion 71, and faces the distal end of the terminal 63.

The height (second distance d2) of an inner wall of the tubular portion 71 is equal to the length of the portion of the terminal 63 that is exposed through the wall constituting the holding frame 21.

The cap 70 is composed of an insulating member.

The cap 70 is composed of a resin that is deformed by heat, such as polyvinyl chloride.

Specifically, the cap 70 is composed of a material that becomes soft and be deformed when a temperature Tt of a region of the terminal 63 that is in contact with the inner wall of the tubular portion 71 becomes equal to or higher than a first temperature T1 (for example, T1=65° C.), and the cap 70 falls from the terminal 63 due to said deformation.

The first temperature T1 is a temperature of the terminal 63 that is not likely to be reached when the resistor R is operating normally, but is likely to be reached when the resistor R is not operating normally.

It is desirable that the cap 70 is composed of a material whose color changes depending on the temperature.

For example, the cap 70 becomes a first color (red) when a temperature Tc of the cap 70 becomes the first temperature T1, and becomes a second color (white) when the temperature Tc is lower than the first temperature T1.

(Arrangement of Resistors R)

In order to efficiently perform cooling by the cooling unit 30, the resistors R of each resistor row are arranged in such a way that a resistor R of a resistor row is arranged at a position corresponding to a middle between resistors R adjacent to each other in the x direction in another resistor row adjacent to the resistor row in the z direction.

(Relay Unit 25)

The relay unit 25 is used to control power supply from the test target power supply to any one of the resistor groups.

A relay of the relay unit 25 is provided for each resistor group in the resistor unit 20.

The relay unit 25 includes first to twelfth relays 25a to 25l.

The first relay 25a is used for on/off control of the first resistor group G1.

The second relay 25b is used for on/off control of the second resistor group G2.

The third relay 25c is used for on/off control of the third resistor group G3.

The fourth relay 25d is used for on/off control of the fourth resistor group G4.

The fifth relay 25e is used for on/off control of the fifth resistor group G5.

The sixth relay 25f is used for on/off control of the sixth resistor group G6.

The seventh relay 25g is used for on/off control of the seventh resistor group G7.

The eighth relay 25h is used for on/off control of the eighth resistor group G8.

The ninth relay 25i is used for on/off control of the ninth resistor group G9.

The tenth relay 25j is used for on/off control of the tenth resistor group G10.

The eleventh relay 25k is used for on/off control of the eleventh resistor group G11.

The twelfth relay 25l is used for on/off control of the twelfth resistor group G12.

(Cooling Unit 30)

The cooling unit 30 including a cooling fan is provided below the resistor unit 20 (the lower portion of the frame 10).

Figure 3:
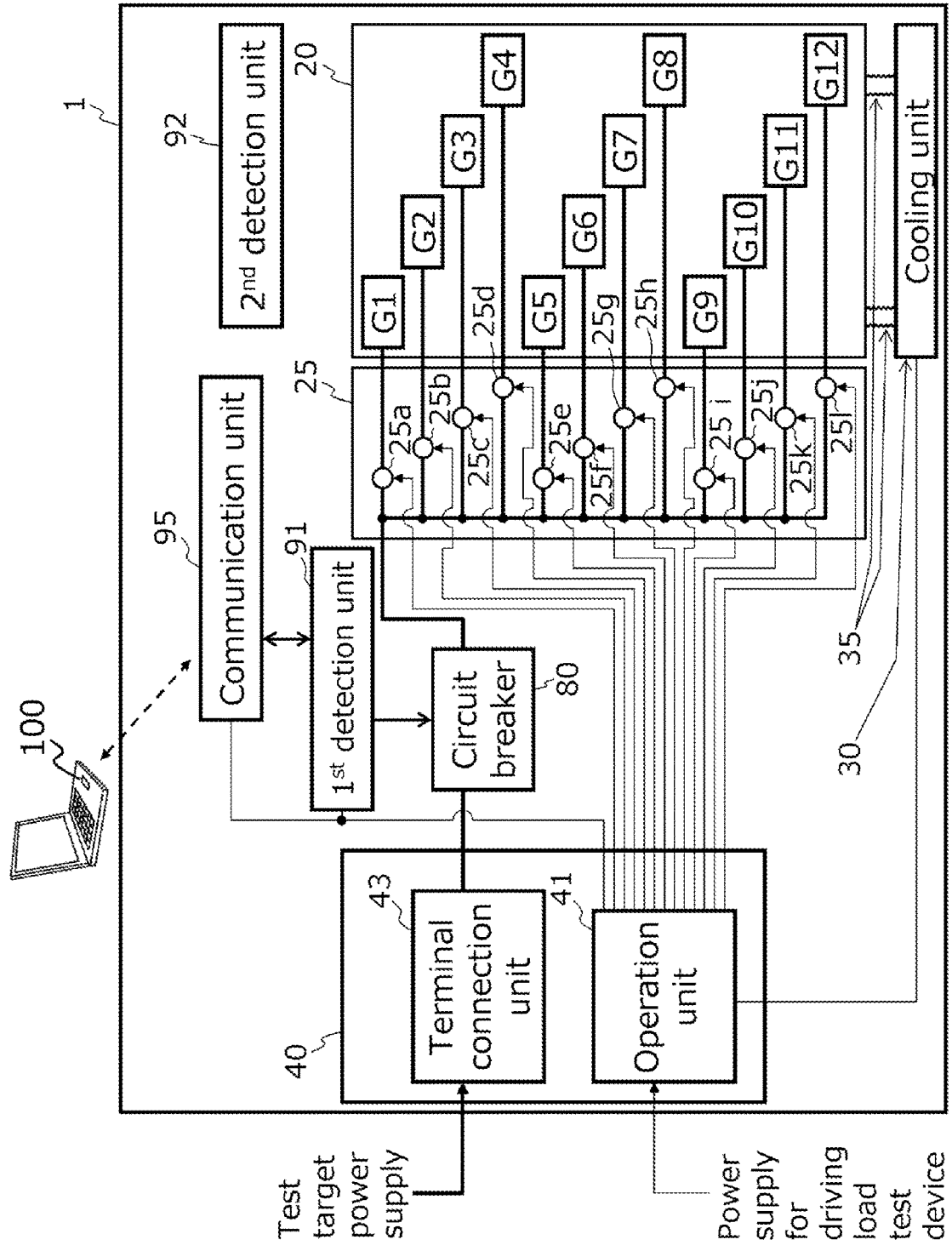
FIG. 3 is a schematic diagram illustrating a configuration of the load test device according to the present embodiment.
Figure 4:
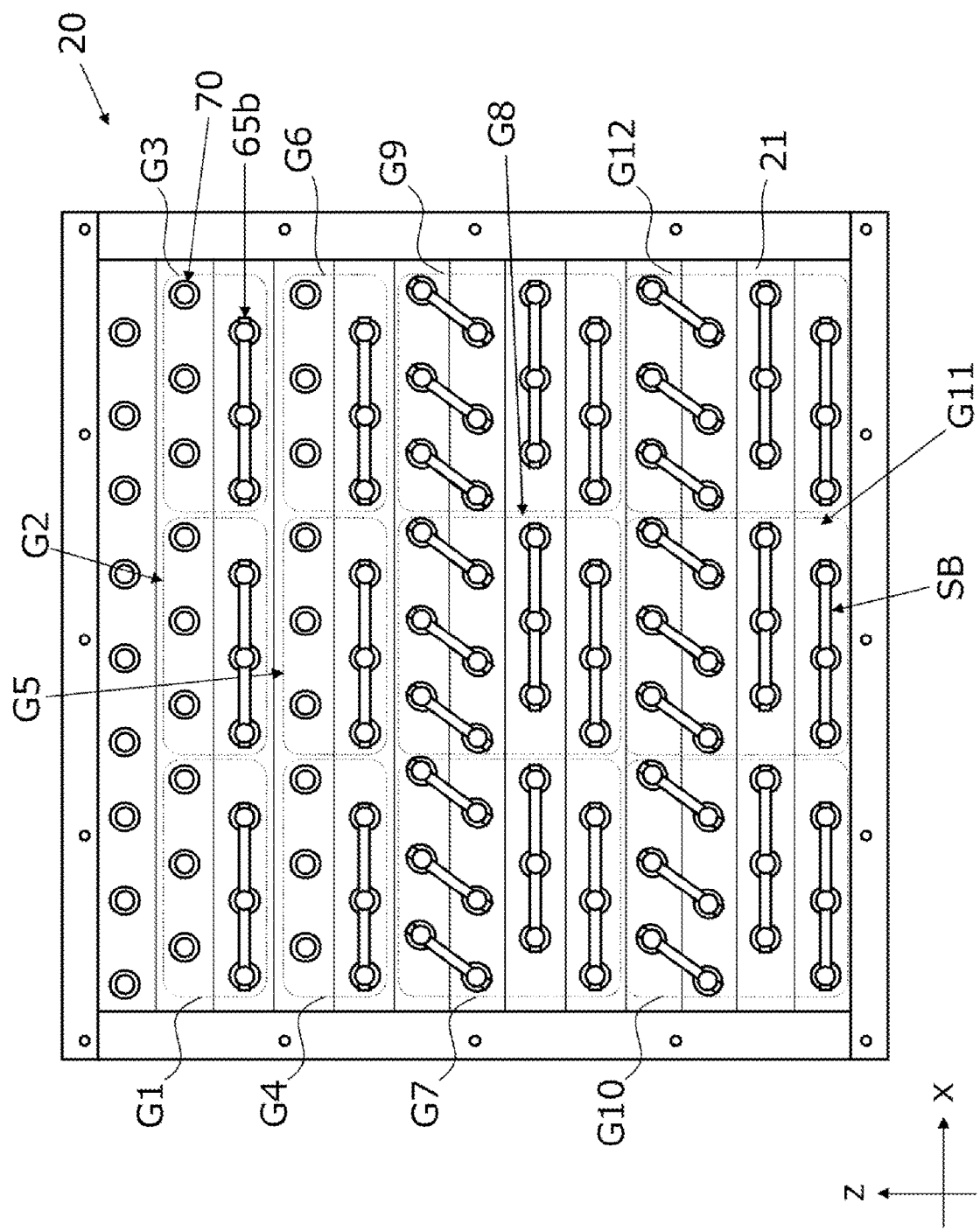
FIG. 4 is a view illustrating one side surface of a resistor unit.
Figure 5:
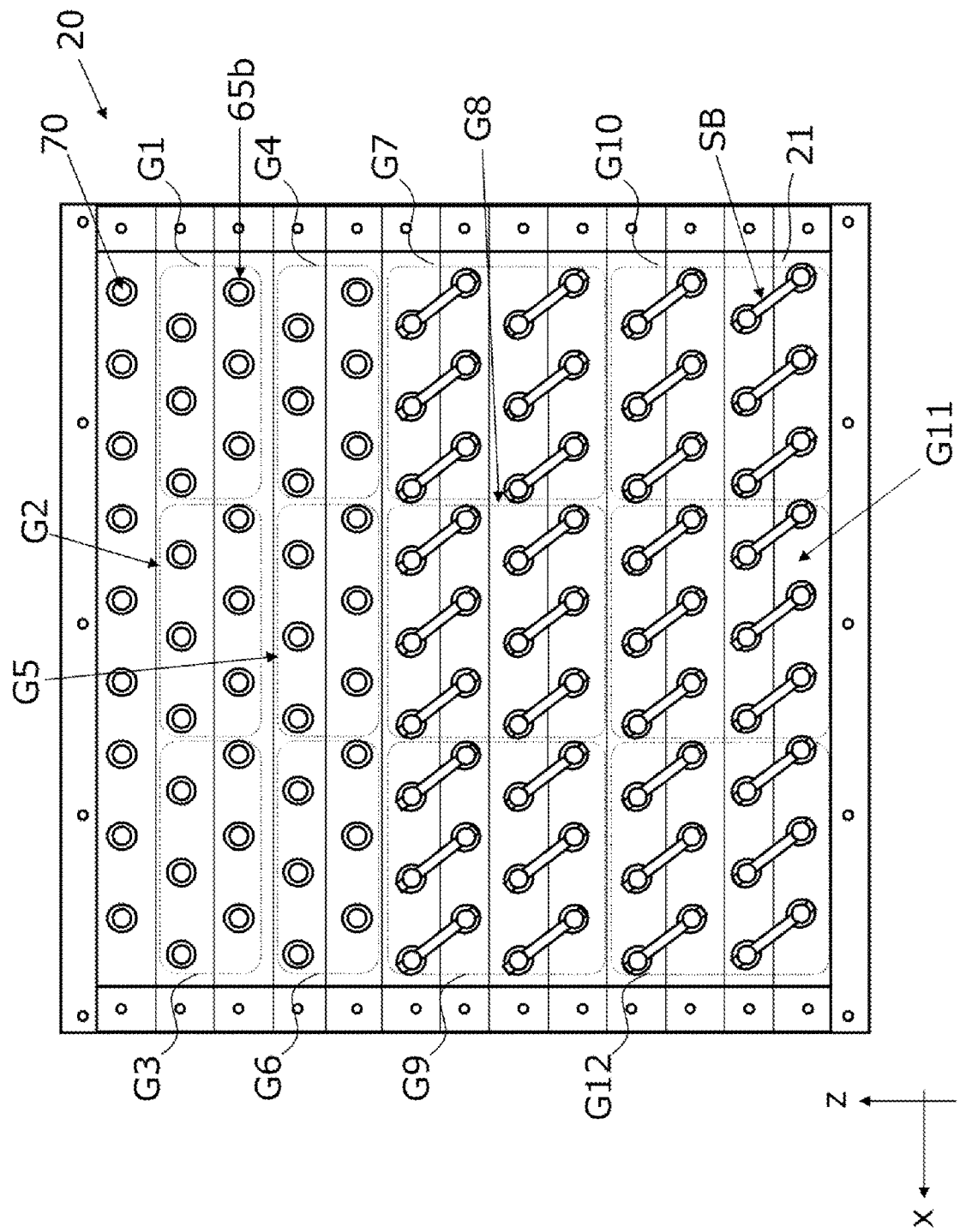
FIG. 5 is a view illustrating the other side surface of the resistor unit.

The cooling unit 30 and the relay unit 25 are driven based on a power supply (a power supply for driving the load test device) different from the test target power supply (see FIG. 3).

In a case of performing a load test for an air conditioning facility that cools a computer server or the like, the resistors R of the first to twelfth resistor groups G1 to G12 of the resistor unit 20 receive power supplied from the power supply for driving the load test device via the circuit breaker 80. Even in a case of performing the load test for the test target power supply, the cooling unit 30 and the relay unit 25 may be driven based on the test target power supply.
(Insulator 35)

The insulator 35 is provided at a position where insulation due to separation is necessary, such as a position between the frame 10 and the resistor unit 20 or a position between the resistor unit 20 and the cooling unit 30.
(Connection Switching Unit 40)

The connection switching unit 40 includes an operation unit 41 and the terminal connection unit 43 (see FIGS. 2 and 3). The terminal connection unit 43 may be disposed at a position away from the operation unit 41 (for example, a back surface of the operation unit 41 and the like).

The operation unit 41 includes a mode switch 41*a* and resistor switches 41*b*.

The mode switch 41*a* is a rotary operation switch, and is used to turn on/off the load test device 1 and to select the type of the test target power supply (mode switching).

The resistor switches 41*b* are slide-type (or toggle-type or push-button-type) operation switches, and are switches for performing on/off control on the relays of the first to twelfth resistor groups G1 to G12. The resistor switches 41*b* include first to twelfth operation switches S1 to S12.

When the first operation switch S1 is turned on, the relay (first relay 25*a*) of the first resistor group G1 is turned on (conductive state), so that it becomes in a state in which a current from the test target power supply connected to the load test device 1 can flow to the first resistor group G1 via the terminal connection unit 43.

Similarly, when the second to twelfth operation switches S2 to S12 are turned on, the relays of the corresponding resistor groups are turned on (conductive state), and it becomes in a state in which a current from the test target power supply connected to the load test device 1 can flow to the resistor groups via the terminal connection unit 43.

When a rotational position of the mode switch 41*a* is adjusted to a rotational position (operation mode) corresponding to the type of the test target power supply, the cooling fan of the cooling unit 30 is driven, and on/off control is performed on the relays (the first to twelfth relays 25*a* to 25*l*) of the first to twelfth resistor groups G1 to G12 based on the operation state of the resistor switches 41*b*.

Note that a main power switch may be provided, and when the main power switch is turned on and the rotational position of the mode switch 41*a* is adjusted to the rotational position (operation mode) corresponding to the type of test target power supply, the cooling fan may be driven, and on/off control may be performed on the relays (the first to twelfth relays 25*a* to 25*l*) of the first to twelfth resistor groups G1 to G12.

The terminal connection unit 43 is a terminal for connecting the test target power supply.

The test target power supply and the first to twelfth resistor groups G1 to G12 are brought into a connectable state via the terminal connection unit 43 and the circuit breaker 80.
(Circuit Breaker 80)

The circuit breaker 80 is implemented by a vacuum circuit breaker (VCB) or the like, and is provided between the resistor unit 20 and the terminal connection unit 43. When the circuit breaker 80 is in an on state, power from the test target power supply is supplied to the resistor unit 20. When the circuit breaker 80 is in an off state, supply of power from the test target power supply to the resistor unit 20 is stopped.

The on/off control of the circuit breaker 80 is performed based on the operation state of the mode switch 41*a*.

When the rotational position of the mode switch 41*a* is adjusted to the rotational position (operation mode) corresponding to the type of the test target power supply and the load test device 1 is turned on, the circuit breaker 80 is turned on.

While the load test device 1 is operating normally, the on state of the circuit breaker 80 is maintained.

In a case where it is determined that there is an abnormality in the load test device 1 based on information from the first detection unit 91, the circuit breaker 80 is turned off.

When the rotational position of the mode switch 41*a* is adjusted to a rotational position (stop mode) corresponding to turning off and the load test device 1 is turned off, the circuit breaker 80 is turned off.
(First Detection Unit 91)

The first detection unit 91 acquires information regarding a temperature, a humidity, a sound, a vibration, an impact, a discharge voltage, a smell, and the like, of periphery.

The first detection unit 91 is electrically connected to another device (the circuit breaker 80 or the communication unit 95) included in the load test device 1.

The first detection unit 91 is driven based on a power supply (the power supply for driving the load test device) different from the test target power supply or a built-in battery.

The first detection unit 91 is provided, for example, in a region where the terminal 63 and the cap 70 are located inside the frame 10.

In this case, the first detection unit 91 acquires, inside the frame 10, information regarding at least one of a temperature, a humidity, a sound, an impact, a discharge voltage, or a smell in the region where the terminal 63 and the cap 70 are located.

In a case where the first detection unit 91 is implemented by a sensor that acquires information regarding a discharge voltage, and the cover 11 is composed of a radio wave transmissive material, the first detection unit 91 may be provided outside the load test device 1.

In a case where the first detection unit 91 is implemented by a sensor that acquires information regarding a vibration of the cover 11 based on electromagnetic waves generated from the resistor R, the first detection unit 91 may be provided outside the load test device 1.

The vibration of the cover 11 based on the electromagnetic waves generated from the resistor R is different between a case where the resistor R is normally operating and a case where the resistor R is not normally operating. Therefore, the first detection unit 91 or the like records at least one of a vibration pattern in a case where the resistor R is operating normally or a vibration pattern in a case where the resistor R is not operating normally, and off control to be described later can be performed based on comparison with the vibration acquired by the first detection unit 91.

On/off control of the circuit breaker 80 is performed based on the information acquired by the first detection unit 91.

The information acquired by the first detection unit 91 is transmitted to an external device 100 through the communication unit 95.

That is, the information acquired by the first detection unit 91 is used for operation of other devices of the load test device 1.
(Example of Off Control)

For example, in a case where a temperature T detected by the first detection unit 91 is equal to or higher than a first temperature threshold Tth1, a control device of the first detection unit 91 (or another control device) determines that there is an abnormality in the load test device 1 and turns off the circuit breaker 80.

In a case where a humidity H detected by the first detection unit 91 is equal to or higher than a first humidity threshold Hth1, the control device of the first detection unit 91 (or another control device) determines that there is an abnormality in the load test device 1 and turns off the circuit breaker 80.

In a case where the first detection unit 91 detects at least one of a sound or an impact caused by falling of the cap 70, the control device of the first detection unit 91 (or another control device) determines that there is an abnormality in the load test device 1 and turns off the circuit breaker 80.

Specifically, in at least one of a case where a difference between a waveform of a sound caused by falling of the cap 70 recorded in advance in the first detection unit 91 or the like and a waveform of a sound detected by the first detection unit 91 is small or a case where a difference between a waveform of a vibration caused by falling of the cap 70 recorded in advance in the first detection unit 91 or the like and a waveform of a vibration detected by the first detection unit 91 is small, it is determined that at least one of the sound or the impact caused by the falling of the cap 70 has been detected.

In a case where a discharge voltage V detected by the first detection unit 91 is equal to or higher than a first voltage threshold Vth1, the control device of the first detection unit 91 (or another control device) determines that there is an abnormality in the load test device 1, and turns off the circuit breaker 80.

In a case where the first detection unit 91 detects a burnt smell or the like, the control device of the first detection unit 91 (or another control device) determines that there is an abnormality in the load test device 1, and turns off the circuit breaker 80.

(Display Unit 91a)

It is desirable that the first detection unit 91 includes a display unit 91a that outputs information detected by the first detection unit 91 by light.

For example, in a case where the information detected by the first detection unit 91 does not include information at the time of abnormality (first state), the display unit 91a emits light of a third color (green).

In a case where the information detected by the first detection unit 91 includes information close to that at the time of abnormality (second state), the display unit 91a preferentially emits light of a fourth color (yellow) rather than light of the third color.

Specifically, in at least one of a case where the temperature T detected by the first detection unit 91 is equal to or higher than a second temperature threshold Tth2 (Tth2<Tth1) and lower than the first temperature threshold Tth1, a case where the humidity H detected by the first detection unit 91 is equal to or higher than a second humidity threshold Hth2 (Hth2<Hth1) and lower than the first humidity threshold Hth1, or a case where the discharge voltage V detected by the first detection unit 91 is equal to or higher than a second voltage threshold Vth2 (Vth2<Vth1) and lower than the first voltage threshold Vth1, the display unit 91a emits light of the fourth color (yellow).

In a case where the information detected by the first detection unit 91 includes information at the time of abnormality, the display unit 91a emits light of a fifth color (red) preferentially over the light of the third color and the light of the fourth color.

Specifically, in at least one of a case where the temperature T detected by the first detection unit 91 is equal to or higher than the first temperature threshold Tth1, a case where the humidity H detected by the first detection unit 91 is equal to or higher than the first humidity threshold Hth1, or a case where the discharge voltage V detected by the first detection unit 91 is equal to or higher than the first voltage threshold Vth1, the display unit 91a emits light of the fifth color (red).

(Second Detection Unit 92)

The second detection unit 92 is composed of a member whose color changes according to a state (whether the temperature is high or not) of the attached portion.

In a state of not communicating with the external device 100 and not electrically connected to other devices included in the load test device 1, the second detection unit 92 is provided at a portion (specific portion) of the load test device 1 at which an abnormality may occur during the load test and which is visible from the outside through the cover 11.

For example, the second detection unit 92 is attached to the short-circuit bar SB.

In this case, the second detection unit 92 becomes the first color (red) when a temperature Ts of the short-circuit bar SB becomes equal to or higher than a predetermined second temperature T2 (for example, T2=50° C.), and becomes the second color (white) when said temperature Ts is lower than second temperature T2.

The second temperature T2 is a temperature of the short-circuit bar SB that is not likely to be reached when the resistor R is operating normally, but is likely to be reached when the resistor R is not operating normally.

(Communication Unit 95)

The communication unit 95 wirelessly communicates with a device (external device 100) provided outside the load test device 1.

The information obtained by first detection unit 91 is transmitted to the external device 100 via the communication unit 95.

The information transmitted from the external device 100 is received by the communication unit 95.

A signal from the external device 100 may be received, and the on/off control of the circuit breaker 80 may be performed based on said signal.

For example, the external device 100 displays detection information from the first detection unit 91, and a user of the external device 100 performs an instruction signal transmission operation related to the off control of the circuit breaker 80.

The external device 100 transmits an instruction signal related to the off control to the communication unit 95, and once the communication unit 95 receives the instruction signal related to said off control, the control device of the first detection unit 91 (or another control device) turns off the circuit breaker 80.

(Effect Obtained by Providing Cap 70 Deformed by Heat and Detached)

In a case where the nut 66 is loose, the resistor R may generate more heat than in a normal state as compared with a case where the nut 66 is sufficiently fastened.

In a case where the resistor R generates more heat than in a normal state, the cap 70 is deformed by the heat and detached from the terminal 63. For this reason, for example, when the resistor R generates more heat than in a normal state, it is possible to easily visually recognize a situation in which the resistor R generates heat from the outside due to deformation of the cap 70 and detachment of the cap 70 from the terminal 63.

That is, it is possible to detect a failure of the load test device 1 at an early stage.

(Effect Obtained by Providing Transparent Cover 11)

By providing the cover 11, it is possible to prevent dust or the like from entering from the outside and adhering to the terminal 63 or the like.

As the cover 11 is composed of a transparent material, it becomes possible to visually recognize a region where the terminal 63 is located inside the load test device 1 from the outside.

In addition, the cover 11 vibrates based on electromagnetic waves generated from the resistor R or the like, and functions as a speaker that generates a sound based on said electromagnetic waves. The vibration of the cover 11 based on the electromagnetic waves generated from the resistor R or the like is different between a case where the resistor R is normally operating and a case where the resistor R is not normally operating. Therefore, a worker or the like around the load test device 1 can listen to the sound based on the vibration of the cover 11 and determine whether said sound is a sound when the resistor R or the like is operating normally or a sound when the resistor R or the like is not operating normally.

(Effect Obtained by Increasing Distance Between Terminal 63 and Cover 11)

The distance between the terminal 63 and the cover 11 is larger than a dimension of the cap 70 in the height direction (the sum of the dimensions of the tubular portion 71 and the lid portion 73 in the height direction). Therefore, a space where the cap 70 deformed by heat falls downward is sufficiently secured.

By comparing the terminal 63 from which the cap 70 is detached with the terminal 63 covered with the cap 70, it becomes possible to easily determine a resistor R in which a failure has occurred.

(Effect Obtained by Changing Color of Cap 70)

Since the color of the cap 70 changes by heat, it is possible to visually recognize, for example, a situation in which the resistor R generates more heat than in a normal state from the outside by the color change when the resistor R generates more heat than in a normal state.

(Effect Obtained by Providing First Detection Unit 91)

The first detection unit 91 detects a temperature, a humidity, a sound, an impact, a discharge voltage, a smell, or the like, and thus, in a case where there is an abnormality in the load test device 1, it becomes possible to stop (perform off control) application of a voltage to the resistor R or notify the external device 100 based on these pieces of information.

In particular, in a case where the nut 66 is loose, the discharge voltage V may increase as compared with a case where the nut 66 is sufficiently fastened.

However, in the present embodiment, since the first detection unit 91 performs the off control based on the discharge voltage V or the like, it becomes possible to find a failure of the load test device 1 at an early stage.

(Effect Obtained by Providing Display Unit 91a)

The display unit 91a emits light based on the information acquired by the first detection unit 91, so that the information regarding whether or not an abnormality has occurred in the load test device 1 can easily be visually recognized from the outside.

(Effect Obtained by Providing Second Detection Unit 92)

Similarly to the first detection unit 91, the second detection unit 92 acquires information such as a temperature.

The second detection unit 92 is not electrically connected to and does not communicate with another device.

Therefore, the second detection unit 92 can be more easily arranged in a complicated load test device 1 having many wirings as compared with a detection member that is electrically connected to or communicates with another device, such as the first detection unit 91.

(Modification of Cap 70)

In the present embodiment, the cap 70 includes the tubular portion 71 and the lid portion 73, and one of openings of the tubular portion 71 is closed by the lid portion 73.

Figure 12:
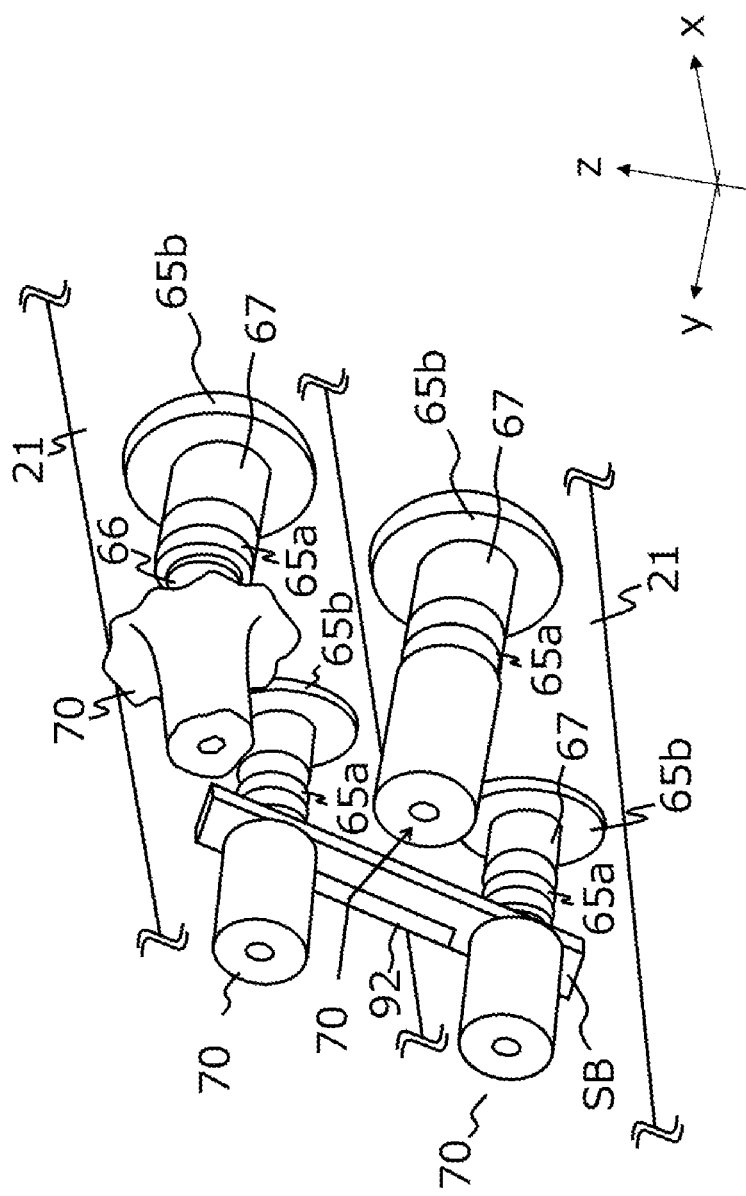
FIG. 12 is a perspective view illustrating the periphery of the terminals of the resistors at the moment when one of caps without a lid portion is deformed and detached from the terminal.
Figure 13:
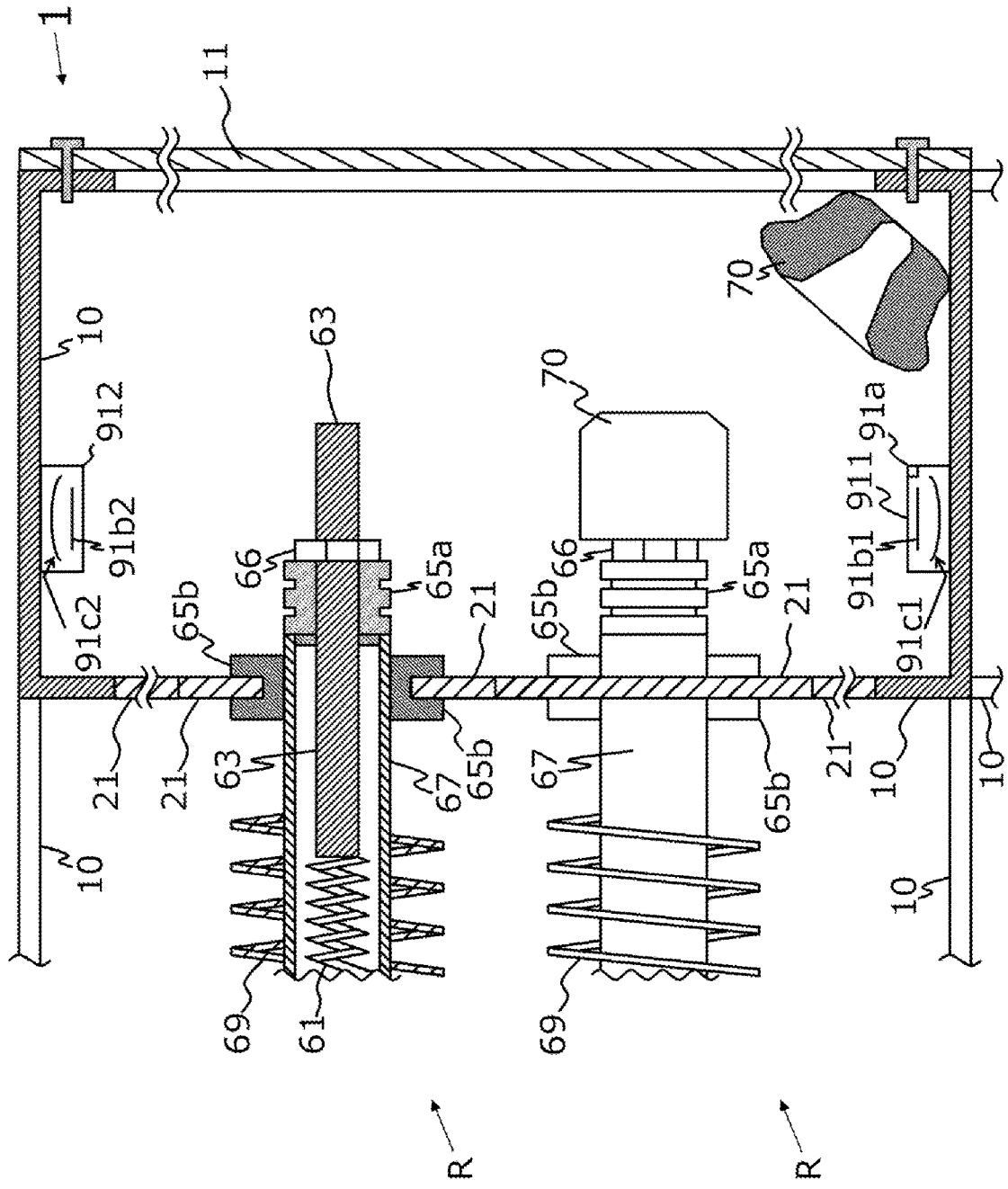
FIG. 13 is a cross-sectional configuration diagram illustrating a positional relationship among the resistors, the holding frame, the cover, and the first detection unit (a first device and a second device) after one of the caps without the lid portion is deformed and detached from the terminal after the cover and the caps without the lid portion are attached.

However, the cap 70 does not have to include the lid portion 73, and the opposite ends of the tubular portion 71 may be opened (see FIGS. 12 and 13).

In this case, the terminal 63 is inserted into one end portion of the tubular portion 71 of the cap 70 in a state where the other end portion of the tubular portion 71 is opened.

(Modification 1 of First Detection Unit 91)

In the present embodiment, an example has been described in which the first detection unit 91 is composed of a sensor that acquires information regarding a temperature, a humidity, a sound, a vibration, an impact, a discharge voltage, a smell, and the like, of periphery.

However, instead of or in addition to said sensor, the first detection unit 91 may be composed of a communication device that transmits radio waves and receives the radio waves may be included (see FIG. 13).

In this case, the first detection unit 91 includes a first device 911 and a second device 912.

The first device 911 includes the display unit 91a, a first communication unit 91b1, and a first reflection unit 91c1.

The second device 912 includes a second communication unit 91b2 and a second reflection unit 91c2.

The first device 911 and the second device 912 are provided in a region where the terminal 63 and the cap 70 are located inside the frame 10, and are arranged in a positional relationship in which the region where the terminal 63 and the cap 70 are located is sandwiched.

For example, the first device 911 is arranged below the region where the terminal 63 and the cap 70 are located inside the frame 10, and the second device 912 is disposed above the region where the terminal and the cap 70 are located inside the frame 10.

The first communication unit 91b1 transmits a first signal to the second communication unit 91b2 and receives a second signal from the second communication unit 91b2.

The first reflection unit 91c1 reflects the first signal from the first communication unit 91b1 toward the direction (upper side) where the second communication unit 91b2 is located, and reflects the second signal from the second communication unit 91b2 toward the direction (lower side) where the first communication unit 91b1 is located.

The second communication unit 91b2 transmits the second signal toward the first communication unit 91b1 and receives the first signal from the first communication unit 91b1.

The second reflection unit 91c2 reflects the second signal from the second communication unit 91b2 toward the direction (lower side) where the first communication unit 91b1 is located, and reflects the first signal from the first communication unit 91b1 toward the direction (upper side) where the second communication unit 91b2 is located.

The control device of the first detection unit 91 (or another control device) performs the off control of the circuit breaker 80 based on information regarding the radio waves such as a radio wave intensity and the waveform of each of the second signal received by the first communication unit 91b1 and the first signal received by the second communication unit 91b2.

Furthermore, the information regarding the radio waves may be transmitted to the external device 100 via the communication unit 95.

Since there is a difference in electromagnetic waves generated from the resistor R and the like between a case where the resistor R or the like is operating normally and a case where the resistor R or the like is not operating normally, a difference occurs in the radio wave intensity and the waveform of the second signal received by the first communication unit 91b1 from the second communication unit 91b2 and in the radio wave intensity and the waveform of the first signal received by the second communication unit 91b2 from the first communication unit 91b1.

A difference occurs in the radio wave intensity and the waveform of the second signal received by the first communication unit 91b1 from the second communication unit 91b2 and the radio wave intensity and the waveform of the first signal received by the second communication unit 91b2 from the first communication unit 91b1 between a state in which the cap 70 is attached and a state in which the cap 70 is detached.

A difference occurs in the radio wave intensity and the waveform of the second signal received by the first communication unit 91b1 from the second communication unit 91b2 and the radio wave intensity and the waveform of the first signal received by the second communication unit 91b2 from the first communication unit 91b1 between a state in which the color of the cap 70 is not changed by heat and a state in which the cap 70 has been changed by heat.

Therefore, the first detection unit 91 or the like records the radio wave intensity, the waveform, and the like when the resistor R or the like is operating normally, and it is possible to perform the OFF control of the circuit breaker 80 based on at least one of the radio wave intensity or the waveform.

Examples of communication means of the wireless communication performed by the first communication unit 91b1 and the second communication unit 91b2 include communication means that transmits its own identification information to the outside while the wireless communication means is turned on, such as IEEE 802.15.1 (Bluetooth (registered trademark), 2.4 GHz), or IEEE 802.11 (wireless LAN, 2.4 GHz or 5 GHz) in addition to a communication method such as a telephone line and an RF tag.

By providing the first reflection unit 91c1 and the second reflection unit 91c2, the reception sensitivity of the first communication unit 91b1 and the second communication unit 91b2 can be enhanced.

One of the first communication unit 91b1 and the second communication unit 91b2 may perform only signal transmission, and the other of the first communication unit 91b1 and the second communication unit 91b2 may perform only signal reception.

An example in which one first communication unit 91b1 and one second communication unit 91b2 are provided in the load test device 1 has been described. However, a plurality of sets of the first communication unit 91b1 and the second communication unit 91b2 may be provided in a positional relationship in which one or more terminals 63 and one or more caps 70 are sandwiched. In this case, it becomes easy to identify the resistor R in which a failure has occurred.

In addition, a plurality of sets of the first communication unit 91b1 and the second communication unit 91b2 may be provided in a positional relationship in which a relay such as the first relay 25a is sandwiched. In this case, it becomes easy to specify a relay in which a failure has occurred.

(Modification 2 of First Detection Unit 91)

Furthermore, in the present embodiment, an example has been described in which the first detection unit 91 is composed of a sensor that acquires information regarding a temperature, a humidity, a sound, a vibration, an impact, a discharge voltage, a smell, and the like, of periphery.

However, instead of or in addition to said sensor, the first detection unit 91 may detect ultrasonic waves and perform off control or the like based on the ultrasonic waves.

Figure 14:
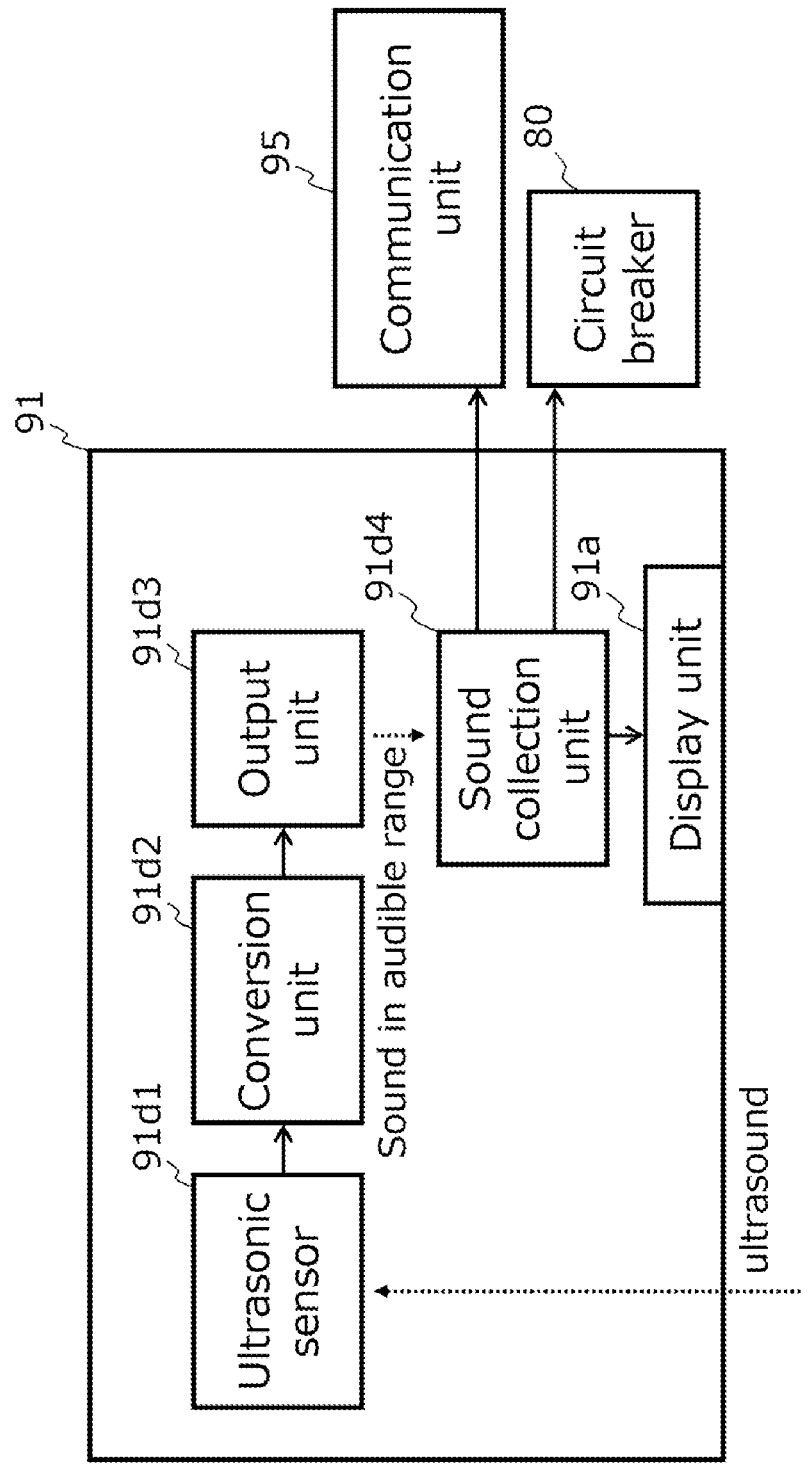
FIG. 14 is a diagram illustrating a configuration of the first detection unit including an ultrasonic sensor.

In this case, the first detection unit 91 includes an ultrasonic sensor 91d1, a conversion unit 91d2, an output unit 91d3, and a sound collection unit 91d4 (see FIG. 14).

The ultrasonic sensor 91d1 is a sensor (or a microphone) that detects a signal having a higher frequency than a predetermined frequency band, that is, ultrasonic waves (for example, a sound of 20,000 Hz or more).

The conversion unit 91d2 converts the frequency of the signal detected by the ultrasonic sensor 91d1 into a frequency in an audible range (for example, 1,000 Hz).

The output unit 91d3 outputs the signal obtained by conversion performed by the conversion unit 91d2 as sound.

The sound collection unit 91d4 collects the sound output by the output unit 91d3.

For example, in a case where the sound corresponding to the ultrasonic waves is collected by the sound collection unit 91d4, the control device of the first detection unit 91 (or another control device) determines that there is an abnormality in the load test device 1 and turns off the circuit breaker 80. Furthermore, information regarding the sound collected by the sound collection unit 91d4 is transmitted to the external device 100 via the communication unit 95. In a case where the sound corresponding to the ultrasonic waves is collected by the sound collection unit 91d4, the display unit 91a emits light of the fifth color (red) or the like.

In a case where deterioration such as carbonization of the inside of the relay of a relay unit 25, contamination of an insulator 35, generation of a leakage current, a failure of the resistor R, or the like has occurred, ultrasonic waves may be emitted from a portion where a failure has occurred. Therefore, by detecting the ultrasonic waves and making the ultrasonic wave be audible or visible, it becomes possible to find a failure of the load test device 1 at an early stage.

Here, a mode has been described in which ultrasonic waves acquired by the ultrasonic sensor 91d1 are converted into an audible range sound and output to determine whether or not ultrasonic waves have been generated.

However, whether or not ultrasonic waves have been generated may be determined by another method such as reading a waveform in information regarding ultrasonic waves acquired by the ultrasonic sensor 91d1.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. The accompanying claims and their equivalents are intended to cover these embodiments and modifications thereof as would fall within the scope and gist of the invention.

REFERENCE SIGNS LIST

1 Load test device
10 Frame

11 Cover
20 Resistor unit
21 Holding frame
25 Relay unit
25a to 25l First to twelfth relays
30 Cooling unit
35 Insulator
40 Connection switching unit
41 Operation unit
41a Mode switch
41b Resistor switch
43 Terminal connection unit
61 Resistance wire
63 Terminal
65a First insulating member
65b Second insulating member
66 Nut
67 Cylindrical portion
69 Heat radiation fin
70 Cap
71 Tubular portion
73 Lid portion
80 Circuit breaker 80
91 First detection unit
911 First device
912 Second device
91a Display unit
91b1 First communication unit
91b2 Second communication unit
91c1 First reflection unit
91c2 Second reflection unit
91d1 Ultrasonic sensor
91d2 Conversion unit
91d3 Output unit
91d4 Sound collection unit
92 Second detection unit
95 Communication unit
100 External device
d1 First distance
d2 Second distance
G1 to G12 First to twelfth resistor groups
H Humidity detected by first detection unit
Hth1 First humidity threshold
Hth2 Second humidity threshold
R Resistor
S1 to S12 First to twelfth operation switches
SB Short-circuit bar
T Temperature detected by first detection unit
T1 First temperature (temperature at which cap is deformed)
T2 Second temperature (temperature at which color of second detection unit changes)
Tc Temperature of cap
Ts Temperature of short-circuit bar
Tt Temperature of terminal
Tth1 First temperature threshold
Tth2 Second temperature threshold
V Discharge voltage detected by first detection unit
Vth1 First voltage threshold
Vth2 Second voltage threshold

The invention claimed is:

1. A load test device comprising:
a resistor unit that includes a plurality of resistors that receive supplied power and a wall that holds opposite ends of each of the plurality of resistors;
an insulating cap that is attached to a portion of a terminal of the resistor that protrudes from the wall; and
a first detection unit that acquires information regarding at least one of a temperature, a humidity, a sound, a vibration, an impact, a discharge voltage, or a smell of a region where the terminal and the cap are located inside the frame,
wherein the cap is composed of a material that is deformed by heat,
the cap is deformed by the heat and detached from the terminal when a temperature of the terminal becomes equal to or higher than a first temperature,
the first detection unit is electrically connected to at least one of other devices included in the load test device, and
at least one of transmission of the information acquired by the first detection unit to an external device or control of stopping power supply to the resistor unit based on the information acquired by the first detection unit is performed.

2. The load test device according to claim 1, further comprising
a cover that is attached to a frame holding the resistor unit and protects an exposed portion of the terminal of the resistor that protrudes from the wall,
wherein the cover is composed of a transparent material or a translucent material.

3. The load test device according to claim 2,
wherein the cap includes a tubular portion that covers the exposed portion of the terminal that protrudes from the wall, and a lid portion that is provided at one end portion of the tubular portion and faces a distal end of the terminal, and
a distance between the cover and the terminal is larger than a sum of dimensions of the tubular portion and the lid portion in a height direction.

4. The load test device according to claim 2, further comprising
a second detection unit that is attached to a specific portion of the load test device and is composed of a member whose color changes according to a state of the specific portion,
wherein the second detection unit is provided at the specific portion that is visible from outside through the cover in a state not electrically connecting to another device included in the load test device.

5. The load test device according to claim 2, wherein the cover vibrates based on electromagnetic waves generated from the resistor.

6. The load test device according to claim 1, wherein the cap is composed of a material that becomes a first color at a temperature equal to or higher than the first temperature and becomes a second color different from the first color at a temperature lower than the first temperature.

7. The load test device according to claim 1, wherein the first detection unit includes a display unit that emits light based on the information acquired by the first detection unit.

8. The load test device according to claim 1,
wherein the cap includes a tubular portion whose opposite ends are opened, and
the terminal is inserted into one end portion of the tubular portion in a state where the other end portion of the tubular portion is opened.

9. A load test device comprising:
a resistor unit that includes a plurality of resistors that receive supplied power and a wall that holds opposite ends of each of the plurality of resistors;
an insulating cap that is attached to a portion of a terminal of the resistor that protrudes from the wall;

a first device including a first communication unit that transmits at least a first signal; and a second device including a second communication unit that receives at least the first signal, wherein the cap is composed of a material that is deformed by heat, the cap is deformed by the heat and detached from the terminal when a temperature of the terminal becomes equal to or higher than a first temperature, the first device and the second device are arranged in a positional relationship in which at least one of a region where the terminal and the cap are located or a region where a relay for controlling power supply to the resistor unit is located is sandwiched, and at least one of transmission of information regarding radio waves of the signal received by the second communication unit to an external device, control of stopping power supply to the resistor unit based on the information regarding the radio waves of the signal received by the second communication unit, or light emission based on the information regarding the radio waves of the signal received by the second communication unit is performed.

10. A load test device comprising:

a resistor unit that includes a plurality of resistors that receive supplied power and a wall that holds opposite ends of each of the plurality of resistors;

an insulating cap that is attached to a portion of a terminal of the resistor that protrudes from the wall;

a first device including a first communication unit that transmits at least a first signal; and a second device including a second communication unit that receives at least the first signal, wherein the cap is composed of a material that is deformed by heat, the cap is deformed by the heat and detached from the terminal when a temperature of the terminal becomes equal to or higher than a first temperature, the second device transmits a second signal, the first device receives the second signal, the first device and the second device are arranged in a positional relationship in which at least one of a region where the terminal and the cap are located or a region where a relay for controlling power supply to the resistor unit is located is sandwiched, and at least one of transmission of information regarding radio waves of the first signal received by the second communication unit and information regarding radio waves of the second signal received by the first communication unit to an external device, control of stopping power supply to the resistor unit based on the information regarding the radio waves of the first signal received by the second communication unit and the information regarding the radio waves of the second signal received by the first communication unit, or light emission based on the information regarding the radio waves of the signal received by the second communication unit and the information regarding the radio waves of the second signal received by the first communication unit is performed.

11. A load test device comprising:

a resistor unit that includes a plurality of resistors that receive supplied power and a wall that holds opposite ends of each of the plurality of resistors;

an insulating cap that is attached to a portion of a terminal of the resistor that protrudes from the wall; and an ultrasonic sensor that detects ultrasonic waves, wherein the cap is composed of a material that is deformed by heat, the cap is deformed by the heat and detached from the terminal when a temperature of the terminal becomes equal to or higher than a first temperature, and at least one of transmission of information acquired by the ultrasonic sensor to an external device or control of stopping power supply to the resistor unit based on the information acquired by the ultrasonic sensor is performed.

12. The load test device according to claim 11, further comprising:

a conversion unit that converts a frequency of a signal obtained by the ultrasonic sensor into a frequency in an audible range; and an output unit that outputs a signal obtained by conversion performed by the conversion unit as a sound.

* * * * *